US005357155A

United States Patent [19]

Wile

[11] Patent Number: 5,357,155

[45] Date of Patent: Oct. 18, 1994

[54] DUAL INPUT SIGNAL SUMMER CIRCUIT

[75] Inventor: Donald T. Wile, San Jose, Calif.

[73] Assignee: National Semiconductor Corporation, Santa Clara, Calif.

[21] Appl. No.: 926,594

[22] Filed: Aug. 7, 1992

[51] Int. Cl.[5] .......................... H03K 5/22; G06F 7/24

[52] U.S. Cl. ...................................... 307/492; 307/529

[58] Field of Search ................ 307/492, 529; 328/145, 328/158

[56] References Cited

U.S. PATENT DOCUMENTS 4,429,416 1/1984 Page .................................... 455/211
4,442,549 4/1984 Main ................................ 307/492 X
4,546,275 10/1985 Pena-Finol et al. ............ 307/529 X
5,057,717 10/1991 Kimura ............................... 307/492

OTHER PUBLICATIONS

M. J. Zuber et al., "A Wide-Bandwidth, High Accuracy Logarithmic Amplifier for Line-Scan Imaging Systems," *Proceedings of the IEEE 1987 Custom Integrated Circuits Conference,* May 4-7, 1987.

*Primary Examiner*—Willis R. Wolfe
*Attorney, Agent, or Firm*—Limbach & Limbach

[57] ABSTRACT

A dual input differential signal summer combines a pair of differential input signals logarithmically to produce a differential output. The input signals are applied to a pair of differential amplifiers the outputs of which are buffered so that they do not interact. The result is an increased circuit transconductance. Where the circuit is employed in a tunable filter integrated circuit employing plural cascaded filter elements, a substantial reduction in chip power is achieved.

6 Claims, 2 Drawing Sheets

DUAL INPUT SIGNAL SUMMER CIRCUIT

BACKGROUND OF THE INVENTION

The basic concept is related to a tunable IC filter which is composed of a Gilbert cell (an analog multiplier) with a capacitor connected across its current output terminals. This creates an R-C filter which can be tuned by means of the Gilbert cell transconductance. This basic concept was published in the February 1981, issue of ELECTRONIC DESIGN on page 44. The teaching in this publication is incorporated herein by reference.

This basic concept has been expanded to create an analog computer filter that is composed of a large number of cascaded tunable filter elements whose tuning are ganged together and operated from a single control. This filter has evolved into a configuration wherein a plurality of cascaded tunable stages incorporate stabilizing amplifier feedback elements. Since the feedforward and feedback amplifier elements share common outputs a single stage involves a differential output and four inputs representing a pair of differential inputs. Thus, the configuration is that of a pair of differential amplifiers having a common output. Ideally, the pair of amplifiers will have the same transconductance which can be varied by a common control.

DESCRIPTION OF THE PRIOR ART

FIG. 1 is a simplified schematic diagram of a circuit that has come into common usage wherein a pair of differential amplifiers are coupled together to provide a common output and a pair of differential inputs (four input terminals). The circuit operates from a common $V_{CC}$ power supply connected + to terminal 10 and − to ground terminal 11. The common output terminals 12 and 13 respectively are developed at the collectors of transistors 14 and 15 which are operated differentially by a constant tail current element 16. The current in element 16 is labeled $I_{TOP}$ because it represents the current flowing in the top portion of the circuit. Constant current sources 17 and 18 respectively supply collector currents to transistors 14 and 15. Each of sources 17 and 18 supply one-half of the current flowing in tail current element 16. Thus, $I_{TOP}=I_{17}+I_{18}$. The bases of transistors 14 and 15 comprise summing nodes 23 and 24, which combine the differential currents flowing in a pair of input stages. Nodes 23 and 24 are each biased at a potential level three diodes below $V_{CC}$ by the action of diodes 19 through 22.

Transistors 25 and 26 form the first differential input stage, the collectors of which are respectively connected to nodes 23 and 24. Constant current sinks 27 and 28 each conduct $I_1$ to respectively bias transistors 25 and 26 which have their emitters coupled together by resistor 29 (RE). Thus, transistors 25 and 26 are biased so as to be differentially operated. Capacitor 30, which shunts resistor 29, couples the emitters of transistors 25 and 26 together at high frequencies. Capacitor 30 functions to ensure differential operation at the applied signal frequencies. Schottky diodes 31 and 32 respectively clamp transistors 25 and 26 so that they cannot be driven into saturation by the applied signals. Input terminals 33 and 34 comprise the differential input of the first differential input stage.

Under quiescent conditions the circuit is balanced and no current will flow in resistor 29. However, when a differential input is present, it will shift the operating potentials so that the input potential difference will appear across resistor 29. This differential bias will appear between the emitters of transistors 25 and 26. An amplified version will then appear between the collectors of transistors 25 and 26 at nodes 23 and 24.

Input terminals 35 and 36 comprise the second differential input and respectively connect to the bases of transistors 37 and 38. Schottky diodes 39 and 40 respectively clamp transistors 37 and 38 so as to avoid saturation in the second differential input stage.

Constant current sinks 41 and 42 each conduct current $I_1$ as bias current for transistors 37 and 38. Resistor 43 couples the emitters of transistors 36 and 37 together for direct current biasing and ensures differential biasing operation. Capacitor 44, which shunts resistor 43, functions in the same manner as capacitor 30. This second differential input stage operates in the same manner as the first stage and its output is coupled in parallel therewith.

Since current $I_1$ flows in transistors 25 and 37 as well as in transistors 26 and 38, it can be seen that 2 $I_1$ flows in each of summing nodes 23 and 24. The basic overall transconductance of the circuit of FIG. 1 is:

$$g_m=I_{TOP}/[2\ I_1RE)$$

The factor 2 in the denominator is due to the fact that 2 $I_1$ flows in each of diodes 21 and 22 which function as logarithermic mixing impedances for nodes 23 and 24. The presence of the factor 2 is a circuit configuration function which effectively halves the overall transconductance. This effect might be avoided by reducing the value of $I_1$, but this would reduce the signal handling capability at the differential input terminals which is unacceptable.

SUMMARY OF THE INVENTION

It is an object of the invention to produce a summing circuit in a dual input signal summer that results in enhanced transconductance.

This object is achieved in a circuit that employs a pair of summing diodes in each of the input stage loads in a dual input stage configuration. Each input stage supplies a pair of currents to the summing diodes which thereby bias the output stage in proportion to the summed currents. This configuration results in a doubling of the overall circuit transconductance.

DESCRIPTION OF THE INVENTION

Figure 1:
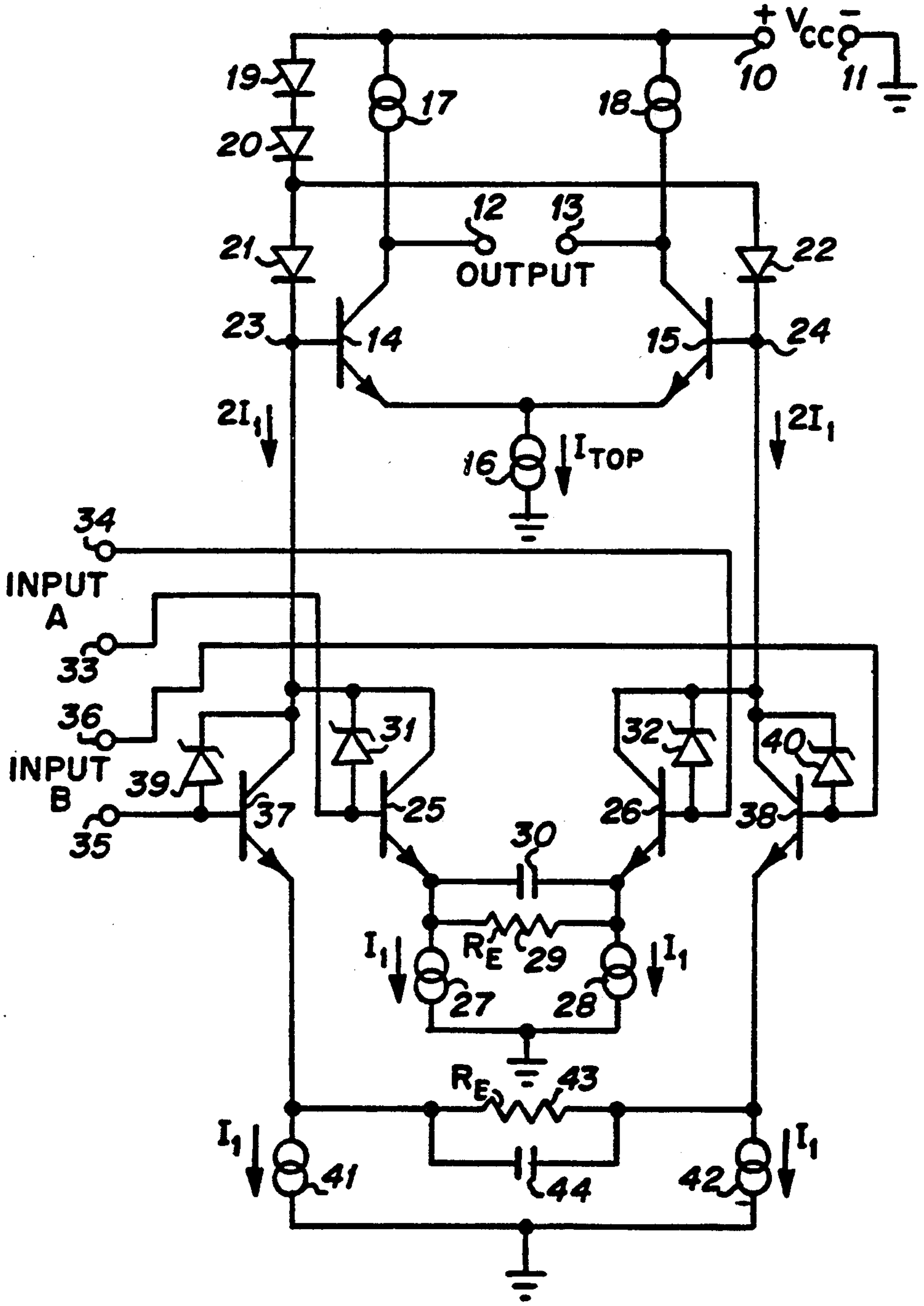
Fig 1 (PRIOR ART)
FIG. 1 is a schematic diagram illustrating a well known prior art dual differential input signal summer circuit.
Figure 2:
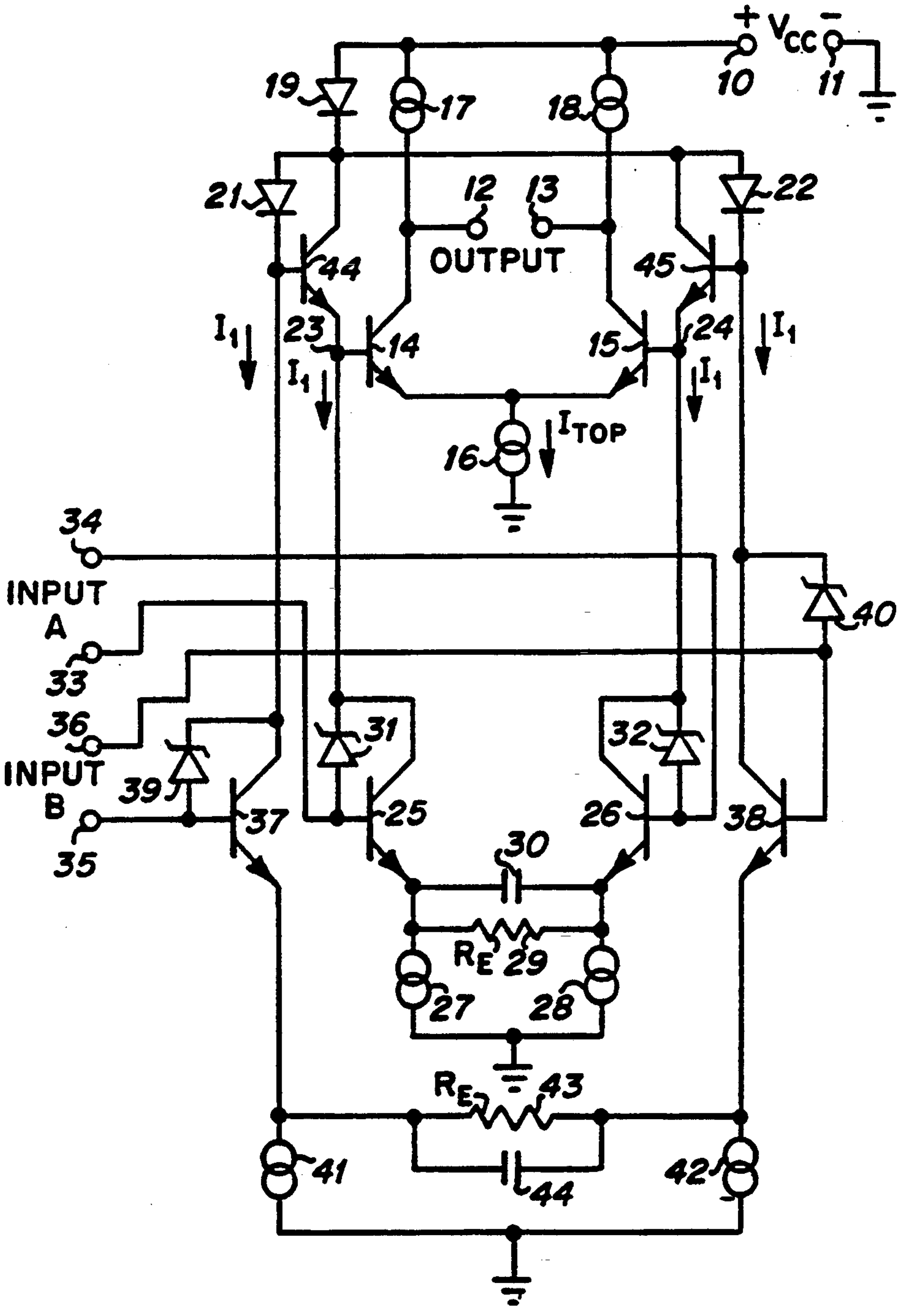
FIG. 2 is a schematic diagram illustrating a circuit in accordance with the invention.

Referring to FIG. 2, which is a schematic diagram of a circuit in accordance with the invention, a pair of differential input signals are summed to produce a single differential output. Where the various circuit components function as they do in FIG. 1, the same designations are used. One of the major differences is that circuit nodes 23 and 24, which represent the input summing terminals of the output stage, comprise the nodes where the two input stages are coupled together indirectly rather than directly connected as in FIG. 1. In FIG. 2, the summing of the two input stages is accomplished by means of a pair of emitter-follower buffers. Thus, while coupled in common to the output stage, there is no direct connection to both input stages.

Emitter follower transistor 46, couples the collector of transistor 37 to node 23, which is directly connected to the collector of transistor 25. Thus, $I_1$ flows out of node 23 into transistor 25. A second quantity of $I_1$ flows through diode 21 into transistor 37. As a result, transistor 46 buffers transistor 37 from node 23 while providing the desired coupling.

Likewise, transistor 45 buffers transistor 38 from node 24 while providing the desired coupling. $I_1$ flows out of node 24 into transistor 26. A similar quantity, $I_1$, flows through diode 22 into transistor 38. It can be seen that diode 19 passes 4 $I_1$. It is also to be noted that nodes 23 and 24 both operate at a potential of three diodes below $V_{CC}$ as does the circuit of FIG. 1.

As a result of the buffering action of transistors 44 and 45, nodes 23 and 24 are not commonly connected to the two input stages. The transconductance of the circuit is:

$$g_m = I_{TOP}/I_1 * RE$$

It will be noted that the transconductance is double that of the circuit of FIG. 1. While this is not a spectacular improvement, it can be significant. In the proposed tunable filter application employing an integrated circuit the filter can employ a large number of cascaded filter stages. For example, in a typical product as many as eight FIG. 2 circuits can exist on a single chip. If the FIG. 1 approach were to be employed, twice the operating current, in transistors 14 and 15 (i.e., TOP), would be required to achieve the same transconductance as that of the invention shown in FIG. 2. This extra power dissipation is significant.

The invention has been described and a preferred embodiment detailed. When a person skilled in the art reads the foregoing description, alternatives and equivalents, within the spirit and intent of the invention, will be apparent. Accordingly, it is intended that the scope of the invention be limited only by the claims that follow.

I claim:

1. A dual input signal summer circuit comprising:

an output stage that includes first and second differentially operated output stage bipolar transistors, the respective bases of the first and second output stage bipolar transistors being connected to first and second signal summing nodes;

a first input stage that includes first and second differentially operated first input stage bipolar transistors, the respective collectors of the first and second first input stage bipolar transistors being connected to the first and second signal summing nodes, the respective bases of the first and second first input stage bipolar transistors being connected to receive first and second signals of a first differential input signal;

a first emitter follower bipolar buffer transistor having a base, an emitter and a collector, the emitter of the first buffer transistor being connected to the first signal summing node;

a second emitter follower bipolar buffer transistor having a base, an emitter and a collector, the emitter of the second buffer transistor being connected to the second signal summing node; and a second input stage that includes first and second differentially operated second input stage bipolar transistors, the respective bases of the first and second second input stage bipolar transistors being connected to receive first and second signals of a second differential input signal, the collector of the first second input stage bipolar transistor being connected to the base of the first buffer transistor, the collector of the second second input stage bipolar transistor being connected to the base of the second buffer transistor.

2. A dual input signal summer circuit as in claim 1 and further comprising:

a first constant current source connected between the collector of the first output stage bipolar transistor and a positive power supply, the collector of the first output stage bipolar transistor providing a first output signal of a differential output of the dual input signal summer circuit; and a second constant current source connected between the collector of the second output stage bipolar transistor and the positive power supply, the collector of the second output stage bipolar transistor providing a second output signal of the differential output.

3. A dual input signal summer circuit as in claim 2 and wherein the emitters of the first and second output stage bipolar transistors are commonly connected to a negative supply voltage via a constant tail current element.

4. A dual input signal summer circuit as in claim 3 and further comprising:

a first diode string connected between the positive power supply and the first signal summing node; and a second diode string connected between the positive power supply and the second signal summing node.

5. A dual input signal summer circuit as in claim 2 and wherein the first input stage further includes:

a first first stage Schottky diode connected between the base and the collector of the first first input stage bipolar transistor;

a second first stage Schottky diode connected between the base and the collector of the second first input stage bipolar transistor;

a first first stage constant current sink connected between the emitter of the first first input stage bipolar transistor and the negative power supply;

a second first stage constant current sink connected between the emitter of the second first input stage bipolar transistor and the negative power supply;

a first stage capacitor connected between the emitters of the first and second first input stage bipolar transistors; and a first stage resistor connected between the emitters of the first and second first input stage bipolar transistors.

6. A dual input signal summer circuit as in claim 2 and wherein the second input stage further includes:

a first second stage Schottky diode connected between the base and the collector of the first second input stage bipolar transistor;

a second second stage Schottky diode connected between the base and the collector of the second second input stage bipolar transistor;

a first second stage constant current sink connected between the emitter of the first second input stage bipolar transistor and the negative power supply;

a second second stage constant current sink connected between the emitter of the second second input stage bipolar transistor and the negative power supply;

a second stage capacitor connected between the emitters of the first and second second input stage bipolar transistors; and a second stage resistor connected between the emitters of the first and second second input stage bipolar transistor.

* * * * *